United States Patent [19]

Soo et al.

[11] Patent Number: 4,839,769
[45] Date of Patent: Jun. 13, 1989

[54] DRIVER PROTECTION CIRCUIT

[75] Inventors: David H. Soo, Mesa; William C. Dunn, Scottsdale, both of Ariz.

[73] Assignee: Motorola, Inc., Schaumburg, Ill.

[21] Appl. No.: 191,934

[22] Filed: May 9, 1988

[51] Int. Cl.⁴ .................. H02H 3/12; H02H 3/18; H02H 3/24
[52] U.S. Cl. ..................... 361/84; 361/56; 361/86; 361/92; 361/111; 307/127; 307/130; 307/246; 307/355
[58] Field of Search ............... 361/56, 84, 91, 92, 361/111, 78, 86; 307/66, 85, 86, 355, 356, 571, 253, 592, 127, 130, 246

[56] References Cited

U.S. PATENT DOCUMENTS

| | | | |
|---|---|---|---|
| 4,020,395 | 4/1977 | Erickson et al. | 361/59 |
| 4,644,255 | 2/1987 | Freymuth | 323/282 |
| 4,665,459 | 5/1987 | Bynum et al. | 361/91 |
| 4,679,112 | 7/1987 | Craig | 361/33 |
| 4,705,322 | 11/1987 | Yiannoulos | 361/91 |

OTHER PUBLICATIONS

Ralston, Anthony, ed. *Encyclopedia of Computer Science and Engineering*, 1983, pp. 774–775.

*Primary Examiner*—A. D. Pellinen
*Assistant Examiner*—David Osborn
*Attorney, Agent, or Firm*—Michael D. Bingham

[57] ABSTRACT

A reverse battery and loss of positive supply voltage detector circuit includes a power field effect transistor for switching a stored inductive energy to the ground supply voltage terminal if there is a disruption in the power supply. A detector circuit senses a reversal of the supply voltage connections as would happen if the battery were connected backwards and enables the power field effect transistor for discharging a negative voltage that may have developed across an inductive load. The detector circuit further senses a loss of the positive supply voltage and enables the power field effect transistor for discharging a negative voltage that may have developed across an inductive load due to the disruption of applied power.

11 Claims, 1 Drawing Sheet

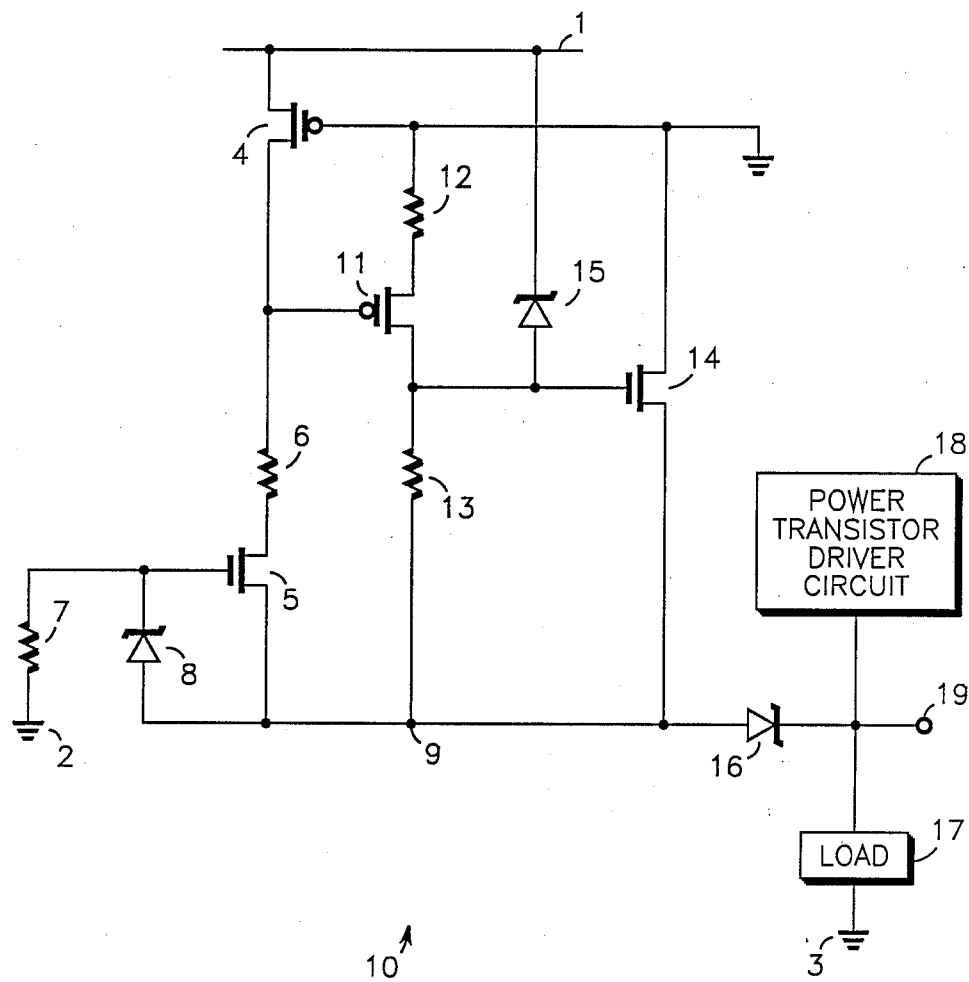

DRIVER PROTECTION CIRCUIT

FIELD OF THE INVENTION

This invention relates in general to the field of driver circuits for inductive loads and more particularly, to a circuit for protecting a driver circuit by detecting a reverse battery condition or loss of the supply voltage with the ability to quickly discharge the energy of an inductive load.

BACKGROUND OF THE INVENTION

There are many applications in automobiles requiring the use of power transistors to drive DC motors, solenoids, and other loads exhibiting inductive characteristics. Examples of these applications include electric fuel pumps, anti-skid braking systems, automatic transmission controllers, windshield wipers, power windows, etc. There are also numerous industrial and commercial applications including robotic mechanical controls and small industrial machines.

Power transistors used to drive DC motors and solenoids have included bipolar, Darlington, and more recently Metal Oxide Semiconductor (MOS) field effect transistors. Common circuit configurations include the 'H' switch for driving DC motors in forward and reverse directions as described in U.S. Pat. No. 4,454,454, and high side and low side drivers for driving motors in one direction or for powering solenoids. The use of power transistors to drive inductive loads in automobile applications subjects the power transistors to many environmental hazards. These hazards include inadvertently shorting the outputs of the power devices to the ground supply voltage, accidentally reversing the battery terminals while connecting or jumping the battery, loss of a battery terminal connection while the ignition is turned on or the automobile is running, or electrical problems in the wiring or charging system.

Driving inductive loads presents a special problem because when current abruptly stops flowing through the inductive load, a voltage of the opposite polarity and of the same magnitude of the original driving voltage appears at the driving node of the inductive load due to the collapsing electric fields in the windings of the inductor. This condition, known as kick-back, can cause damage to the power transistor driver circuits if proper protection is not provided or if the inductive energy is not properly discharged.

Presently, there are several driver circuits using bipolar, Darlington, and MOS power transistors which can detect a short circuit at the inductive load and provide protection therein. However, if the battery connection is reversed or the battery is disconnected, the present circuits are unable to discharge the resulting negative inductive load voltage properly. In some cases this can permanently damage the driver circuit requiring its replacement in the automobile. In automobile applications it is desirable to provide additional protection in order to have a more fail-safe system.

Thus, what is needed is a circuit for protecting a driver circuit by detecting reverse battery conditions or loss of the positive supply voltage with the ability to quickly discharge the energy of an inductive load.

SUMMARY OF THE INVENTION

Accordingly, it is an object of the present invention to provide an improved driver protection circuit.

It is a further object of the present invention to provide an improved driver protection circuit able to detect a reverse battery condition and subsequently discharge a stored inductive energy.

It is still a further object of the present invention to provide an improved driver protection circuit able to detect a loss of supply voltage condition and subsequently discharge a stored inductive energy.

It is a further object of the present invention to provide an improved driver protection circuit capable of quickly discharging a stored inductive energy with minimal power dissipation.

In carrying out the above and other objects of the invention in one form, there is provided a driver protection circuit coupled between first and second supply voltage terminals for receiving first and second supply voltages, respectively, for protecting the semiconductor devices of a driver circuit, wherein the driver circuit provides an output voltage to an inductive load through an output terminal. A diode is coupled between the output terminal and a node for blocking the output voltage when the output voltage is greater than the second supply voltage and less than a selected magnitude for the output voltage, and passing the output voltage when the output voltage is less than the second supply voltage or greater than the selected magnitude for the output voltage. A transistor is coupled between the node and the second supply voltage terminal for selectively discharging the output voltage from the node. A detection circuit is coupled between the first and second supply voltage terminals and coupled to both the node and the transistor for enabling the transistor when the second supply voltage is greater than the first supply voltage.

The above and other objects, features, and advantages of the present invention will be better understood from the following detailed description taken in conjunction with the accompanying drawings.

BRIEF DESCRIPTION OF THE DRAWING

The single FIGURE is a schematic diagram of the preferred embodiment.

DETAILED DESCRIPTION OF THE INVENTION

With reference to the single figure, a driver protection circuit 10 comprises a field effect transistor 4 having a source connected to a supply voltage terminal 1, and a gate connected to a supply voltage terminal 2. A field effect transistor 5 has a drain coupled to the drain of the field effect transistor 4 by a resistor 6, a gate coupled to the supply voltage terminal 2 by a resistor 7, and a source connected to a node 9. A zener diode 8 has a cathode connected to the gate of the field effect transistor 5 and an anode connected to the node 9. The zener diode 8 limits the voltage across the gate and source of the field effect transistor 5 to a base-emitter voltage ($V_{be}$) when the gate potential is less than the source potential, and to its zener breakdown voltage when the gate potential is greater than the source potential. The gate oxide of the field effect transistor 5 is thus protected from high voltage breakdown.

A field effect transistor 11 has a source coupled to the supply voltage terminal 2 by a resistor 12, a gate connected to the drain of the field effect transistor 4, and a drain coupled to the node 9 by a resistor 13. A zener diode 15 has a cathode connected to the supply voltage terminal 1 and an anode connected to the drain of the field effect transistor 11. A zener diode 16 has a cathode connected to an output terminal 19 and an anode connected to the node 9. A power field effect transistor 14 has a drain connected to the supply voltage terminal 2, a gate connected to the anode of the zener diode 15, and a source connected to the node 9. In the preferred embodiment, the channel resistance (rdson) of the power field effect transistor 14 when in the conducting state is typically very low (less than 1 ohm). Several MOS power field effect transistors are suitable for this function, including lateral DMOS, vertical DMOS, and updrain DMOS devices.

A load 17, having inductive characteristics such as a DC motor or solenoid, is coupled between the output terminal 19 and a supply voltage terminal 3. A power transistor driver circuit 18 is connected to the output terminal 19 for providing the current necessary to drive the load 17. The power transistor driver circuit 18 can comprise bipolar, Darlington or MOS field effect transistor devices. An example of an MOS power field effect transistor driver circuit is discussed in U.S. Pat. No. 4,454,454.

Under normal operating conditions, a positive supply voltage is available at the supply voltage terminal 1, and a ground supply voltage is available at the supply voltage terminal 2. Further, the output voltage may vary to some potential above or below the potential of the ground supply voltage. During normal operation, and when the potential of the output voltage is greater than the potential of the ground supply voltage, the field effect transistor 4 will be on and the field effect transistor 5 will be off. This will cause the positive supply voltage to be available at the gate of the field effect transistor 11 causing it to be turned off. The power field effect transistor 14 is kept off by the resistor 13 causing any charge at the gate of the power field effect transistor 14 to discharge to the supply voltage terminal 2 through the zener diode 8. As a result, essentially no power is consumed by the driver protection circuit 10.

As the output voltage goes to a potential at least an N-channel threshold voltage less than the potential of the ground supply voltage, the field effect transistor 5 turns on since its gate potential is held to the ground supply voltage by the resistor 7. A transient current, $I_T$, will flow through the field effect transistor 5 equal to:

$$I_T = (V_1 - V_{19})R_6$$

where $V_1$ is the positive supply voltage, $V_{19}$ is the output voltage, and $R_6$ is the value of the resistance of the resistor 6. By way of example, a resistance of 600,000 ohms for $R_6$ and a 12 volt positive supply voltage, keeps the transient current less than 0.1 milliamp for output voltages down to −72.0 volts. The voltage appearing at the gate of the field effect transistor 11 is not sufficient to turn it on. The power field effect transistor 14 remains in the off state so that the majority of the output voltage is dissipated by the power transistor driver circuit 18.

A loss of supply voltage condition occurs if the positive supply voltage becomes decoupled from the supply voltage terminal 1. In the automobile application this could happen in a number of ways including a broken connection due to vibration, a broken wire due to stress, or battery failure due to a short. When the positive supply voltage is disconnected, the power transistor driver circuit 18 becomes inoperative and, the magnitude of the output voltage drops below the magnitude of the ground supply voltage due to the kick-back effect from the inductance of the load 17. The field effect transistor 4 turns off because its source is no longer connected to any potential. This also causes the field effect transistor 5 to turn on which then discharges the voltage at the gate of the field effect transistor 11 to the ground supply voltage potential. The field effect transistor 11 then begins conducting which charges the gate of the power field effect transistor 14. The power field effect transistor 14 turns on to discharge the output voltage to the ground supply voltage terminal 2. As the output voltage discharges to within an N-channel threshold voltage of the ground supply voltage potential, the field effect transistors 5 and 11, and the power field effect transistor 14 turn off. Thus the output voltage has been effectively discharged with the positive supply voltage decoupled from the supply voltage terminal 1. In effect the output voltage has been used to power the driver protection circuit 10 to discharge itself in the absence of the positive supply voltage.

A reverse battery condition occurs if the supply voltage terminal 1 is connected to the ground terminal of a battery and the supply voltage terminal 2 is connected to the positive terminal of the battery. This could happen accidentally when installing a battery or when jumping or charging a dead battery. During the reverse battery condition, the power transistor driver circuit 18 will become inoperative, and if a current were flowing through the load 17, it will stop. When the current stops flowing through the load 17, the magnitude of the output voltage remains the same but the polarity is reversed so that the magnitude of the output voltage is less than the magnitude of the ground supply voltage because of inductive kick-back.

During the reverse battery condition, the field effect transistor 4 will be off since its gate will be at the positive supply voltage potential and its source will be at the ground supply potential. Because the positive supply voltage is now coupled to the gate of the field effect transistor 5 through the resistor 7, it turns on which further causes the field effect transistor 11 to conduct. The current flowing through the field effect transistor 11 is limited by the resistance of the resistors 12 and 13. The gate of the power field effect transistor 14 is held near the ground supply voltage potential by the coupling of the zener diode 15. The power field effect transistor 14 will turn on thereby discharging the output voltage to the supply voltage terminal 2. Because the rdson of the power field effect transistor 14 is very low, very little power is dissipated and the output voltage is discharged very quickly. As the output voltage at the source of the power field effect transistor 14 discharges towards the ground supply voltage potential, the power field effect transistor 14 turns off.

By now it should be appreciated that there has been provided a driver protection circuit for protecting a driver circuit by detecting a reverse battery condition or loss of the supply voltage with the ability to quickly discharge the energy of an inductive load.

We claim:
1. A circuit comprising:
    a first supply voltage terminal for receiving a first supply voltage;
    a second supply voltage terminal for receiving a second supply voltage;
    an output terminal;
    first means coupled between said output terminal and a node for providing an output voltage to the node when the magnitude of the output voltage is less than the magnitude of the second supply voltage, and for blocking the output voltage from the node until the ouput voltage reaches a predetermined magnitude greater than the magnitude of the second supply voltage;

a power field effect transistor having a source coupled to the node, a drain coupled to said second supply voltage terminal and having a gate;

second means coupled between said first and second supply voltage terminals and coupled to both the node and to the gate of said power field effect transistor for enabling said power field effect transistor when the second supply voltage is greater than the first supply voltage and for detecting an inadvertent uncoupling of the first supply voltage from said first supply voltage terminal for enabling said power field effect transistor for discharging the output voltage from the node; and third means coupled between the gate of said power field effect transistor and said first supply voltage terminal for providing the first supply voltage to said power field effect transistor when the magnitude of the first supply voltage is less than the magnitude of the second supply voltage, and for blocking the first supply voltage from said power field effect transistor until the first supply voltage reaches a predetermined magnitude greater than the magnitude of the second supply voltage.

2. A circuit according to claim 1 wherein said second means comprises:

a first resistor;
a second resistor;
a third resistor;
a fourth resistor;
a first field effect transistor having a source directly connected to said first supply voltage terminal, a gate directly connected to said second supply voltage terminal, and having a drain;
a second field effect transistor having a drain coupled to the drain of said first field effect transistor by said first resistor, a gate coupled to said second supply voltage terminal by said second resistor, and a source directly connected to the node;
a third field effect transistor having a source coupled to said second supply voltage terminal by said third resistor, a gate directly connected to the drain of said first field effect transistor, and a drain directly connected to the gate of said power field effect transistor and coupled to the node by said fourth resistor; and
a first zener diode having a cathode directly connected to the gate of said second field effect transistor and an anode directly connected to the source of said second field effect transistor.

3. A circuit according to claim 2 wherein said first means comprises a second zener diode having an anode directly connected to the node and a cathode directly connected to said output terminal.

4. A circuit according to claim 3 wherein said third means comprises a third zener diode having an anode directly connect to the gate of said power field effect transistor and a cathode directly connected to said first supply voltage terminal.

5. A circuit comprising:
a first supply voltage terminal;
a second supply voltage terminal;
an output terminal;
a first resistor;
a second resistor;
a third resistor;
a fourth resistor;
a power field effect transistor having a source directly connected to said second supply voltage terminal, and having a gate and a drain;
a first field effect transistor having a source directly connected to said first supply voltage terminal, a gate directly connected to said second supply voltage terminal, and having a drain;
a second field effect transistor having a drain coupled to the drain of said first field effect transistor by said first resistor, a gate coupled to said second supply voltage terminal by said second resistor, and a source directly connected to the drain of said power field effect transistor;
a third field effect transistor having a source coupled to said second supply voltage terminal by said third resistor, a gate directly connected to the drain of said first field effect transistor, and a drain directly connected to the gate of said power field effect transistor and coupled to the drain of said power field effect transistor by said fourth resistor;
a first zener diode having a cathode directly connected to the gate of said second field effect transistor and an anode directly connected to the source of said second field effect transistor;
a second zener diode having an anode directly connected to the drain of said power field effect transistor and a cathode directly connected to said output terminal; and
a third zener diode having an anode directly connected to the gate of said power field effect transistor and a cathode directly connected to said first supply voltage terminal.

6. A driver protection circuit for protecting the semiconductor devices of a driver circuit, said driver circuit providing an output voltage to an inductive load through an output terminal, said driver protection circuit having a first supply voltage terminal for receiving a first supply voltage and a second supply voltage terminal for receiving a second supply voltage, said driver protection circuit comprising:

first means coupled between said output terminal and a node for blocking the output voltage when the output voltage is greater than the second supply voltage and less than a predetermined magnitude for the output voltage, and passing the output voltage when the output voltage is less than the second supply voltage or greater than said predetermined magnitude for the output voltage;

second means coupled between the node and said second supply voltage terminal for selectively discharging the output voltage from the node; and third means coupled between said first and second supply voltage terminals and coupled to both the node and said second means for enabling said second means when the second supply voltage is greater than the first supply voltage.

7. A driver protection circuit according to claim 6 wherein said third means detects an inadvertent uncoupling of the first supply voltage from said first supply voltage terminal and enables said second means for discharging the output voltage from the node.

8. A driver protection circuit according to claim 6 wherein said second means comprises a power field effect transistor having a source coupled to the node, a drain coupled to said second supply voltage terminal, and a gate coupled to said third means.

9. A driver protection circuit according to claim 6 wherein said third means comprises:
- a first resistor;
- a second resistor;
- a third resistor;
- a fourth resistor;
- a first field effect transistor having a source coupled to said first supply voltage terminal, a gate coupled to said second supply voltage terminal, and having a drain;
- a second field effect transistor having a drain coupled to the drain of said first field effect transistor by said first resistor, a gate coupled to said second supply voltage terminal by said second resistor, and a source coupled to the node;
- a third field effect transistor having a source coupled to said second supply voltage terminal by said third resistor, a gate coupled to the drain of said first field effect transistor, and a drain coupled to the gate of said power field effect transistor and coupled to the node by said fourth resistor;
- a first zener diode having a cathode coupled to the gate of said second field effect transistor and an anode coupled to the source of said second field effect transistor; and
- fourth means coupled between said second means and said first supply voltage terminal for providing the first supply voltage to said second means when the magnitude of the first supply voltage is less than the magnitude of the second supply voltage, and for blocking the first supply voltage from said second means until the first supply voltage reaches a predetermined magnitude greater than the magnitude of the second supply voltage.

10. A driver protection circuit according to claim 6 wherein said first means comprises a second zener diode having an anode coupled to the node and a cathode coupled to said output terminal.

11. A driver protection circuit according to claim 7 wherein said fourth means comprises a third zener diode having an anode coupled to said second means and a cathode coupled to said first supply voltage terminal.

* * * * *